United States Patent
Tabei et al.

(10) Patent No.: US 9,948,255 B2
(45) Date of Patent: Apr. 17, 2018

(54) AMPLIFICATION CIRCUIT

(71) Applicant: Murata Manufacturing Co., Ltd., Kyoto (JP)

(72) Inventors: Makoto Tabei, Kyoto (JP); Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/639,397

(22) Filed: Jun. 30, 2017

(65) Prior Publication Data

US 2018/0034426 A1 Feb. 1, 2018

(30) Foreign Application Priority Data

Jul. 28, 2016 (JP) ................................ 2016-148985

(51) Int. Cl.
| | |
|---|---|
| H03G 1/00 | (2006.01) |
| H03F 1/22 | (2006.01) |
| H03F 1/30 | (2006.01) |
| H03F 1/56 | (2006.01) |

(52) U.S. Cl.
CPC .......... *H03G 1/0035* (2013.01); *H03F 1/223* (2013.01); *H03F 1/301* (2013.01); *H03F 1/56* (2013.01); *H03F 2200/18* (2013.01); *H03F 2200/222* (2013.01); *H03F 2200/294* (2013.01); *H03F 2200/387* (2013.01)

(58) Field of Classification Search
USPC ............................ 330/289, 311, 277; 33/298
See application file for complete search history.

(56) References Cited

U.S. PATENT DOCUMENTS

| | | | |
|---|---|---|---|
| 7,633,337 B2* | 12/2009 | Nam ...................... | H03F 1/342 330/254 |
| 8,648,656 B2* | 2/2014 | Nozaki ................. | H03F 1/0261 330/298 |
| 2008/0012643 A1 | 1/2008 | Duperray | |
| 2009/0115520 A1 | 5/2009 | Ripley et al. | |

FOREIGN PATENT DOCUMENTS

| | | |
|---|---|---|
| JP | 2008-512926 A | 4/2008 |
| JP | 2012-099915 A | 5/2012 |
| KR | 10-2009-0086633 A | 8/2009 |
| WO | 2006/027755 A1 | 3/2006 |

OTHER PUBLICATIONS

Tse, Michael, Impedance Matching for High-Frequency Circuit Design Elective, Department of Electronic and Information Engineering, Hong Kong Polytechnic University, Sep. 2003, pp. 1-53, Hong Kong Polytechnic University, Hong Kong, China.

* cited by examiner

*Primary Examiner* — Hieu Nguyen
(74) *Attorney, Agent, or Firm* — Pearne & Gordon LLP (57) ABSTRACT

Provided is an amplification circuit that amplifies an input signal and outputs an amplified signal. The amplification circuit includes: an amplification element that outputs the amplified signal from an output terminal thereof; an inductor having one end to which a power supply voltage is supplied and another end that is connected to the output terminal of the amplification element; a variable resistor that is connected in parallel with the inductor; and a resistance value adjusting circuit that adjusts a resistance value of the variable resistor in accordance with the temperature.

10 Claims, 10 Drawing Sheets

AMPLIFICATION CIRCUIT

This application claims priority from Japanese Patent Application No. 2016-148985 filed on Jul. 28, 2016. The content of this application is incorporated herein by reference in its entirety.

BACKGROUND

The present disclosure relates to amplification circuits. Amplification circuits are used in wireless communication systems such as wireless local area networks (LANs) and cellular phones in order to amplify a signal. For example, Japanese Unexamined Patent Application Publication (Translation of PCT Application) No. 2008-512926 (Patent Document 1) discloses a low noise amplifier (LNA) that is used in a receiver of a wireless communication system.

It is sometimes desirable to make the gain of an amplification circuit constant regardless of the temperature. Japanese Unexamined Patent Application Publication (Translation of PCT Application) No. 2008-512926 (Patent Document 1) discloses a configuration that adjusts an inductive load that is provided in parallel with an inductor, but does not disclose a configuration that makes the gain constant regardless of the temperature.

BRIEF SUMMARY

The present disclosure was made in light of the above-described circumstances, and the present disclosure makes it possible to adjust the gain of an amplification circuit in accordance with the temperature.

An embodiment of the present disclosure provides an amplification circuit that amplifies an input signal and outputs an amplified signal. The amplification circuit includes: an amplification element that outputs the amplified signal from an output terminal thereof; an inductor having one end to which a power supply voltage is supplied and another end that is connected to the output terminal of the amplification element; a variable resistor that is connected in parallel with the inductor; and a resistance value adjusting circuit that adjusts a resistance value of the variable resistor in accordance with temperature.

According to the embodiment of the present disclosure, the gain of the amplification circuit can be adjusted in accordance with the temperature.

Other features, elements, characteristics and advantages of the present disclosure will become more apparent from the following detailed description of embodiments of the present disclosure with reference to the attached drawings.

DETAILED DESCRIPTION

Figure 1:
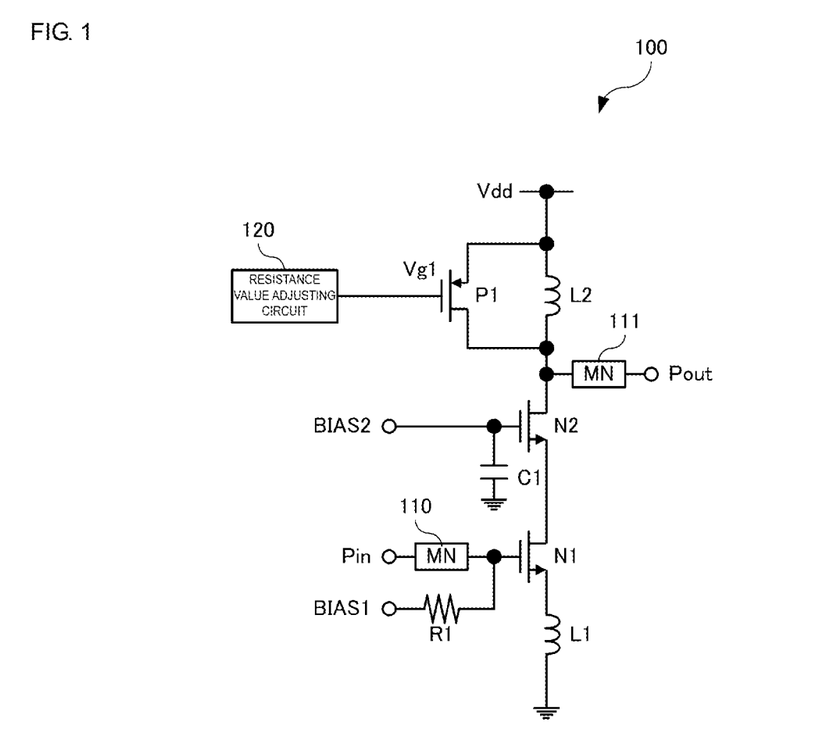
FIG. 1 illustrates the configuration of an amplification circuit according to an embodiment of the present disclosure.

Hereafter, embodiments of the present disclosure will be described while referring to the drawings. FIG. 1 illustrates the configuration of an amplification circuit 100 according to an embodiment of the present disclosure. The amplification circuit 100 amplifies an input signal Pin and outputs an amplified signal Pout. For example, the amplification circuit 100 is an LNA that is used in a receiver of a wireless communication system. As illustrated in FIG. 1, the amplification circuit 100 includes N-channel MOSFETs N1 and N2, a P-channel MOSFET P1, a resistor R1, a capacitor C1, inductors L1 and L2, matching networks (MNs) 110 and 111, and a resistance value adjusting circuit 120.

The N-channel MOSFETs N1 and N2 form a cascode-connected amplifier.

The source of the N-channel MOSFET N1 is connected to one end of the inductor L1 and the other end of the inductor L1 is grounded. The input signal Pin is supplied to the gate of the N-channel MOSFET N1 via the matching network 110. In addition, a bias voltage BIAS1 is supplied to the gate of the N-channel MOSFET N1 via the resistor R1.

The source of the N-channel MOSFET N2 is connected to the drain of the N-channel MOSFET N1. A power supply voltage Vdd is supplied to one end of the inductor L2 and the other end of the inductor L2 is connected to the drain of the N-channel MOSFET N2. A bias voltage BIAS2 is supplied to the gate of the N-channel MOSFET N2. In addition, the gate of the N-channel MOSFET N2 is connected to one end of the capacitor C1 and the other end of the capacitor C1 is grounded.

The amplified signal Pout is output from the drain (output terminal) of the N-channel MOSFET N2 (amplification element) of the cascode-connected amplifier via the matching network 111. In FIG. 1, a cascode-connected amplifier is illustrated, but the amplifier is not limited to this configuration. For example, the amplifier may be formed of a single MOSFET. In addition, the amplification element used in the amplifier may be a bipolar transistor and the amplifier may consist of three or more cascode-connected stages.

The P-channel MOSFET P1 (first FET) is connected in parallel with the inductor L2. Specifically, the source of the P-channel MOSFET P1 is connected to one end of the inductor L2 and the drain of the P-channel MOSFET P1 is connected to the other end of the inductor L2. The gate of the P-channel MOSFET P1 is connected to the resistance value adjusting circuit 120. The P-channel MOSFET P1 functions as a variable resistor having a resistance value that corresponds to a gate voltage Vg1 of the P-channel MOSFET P1. Specifically, the gate-source voltage of the P-channel MOSFET P1 increases and the resistance value of the P-channel MOSFET P1 decreases as the gate voltage Vg1 falls. The variable resistor is not limited to this configuration. For example, an N-channel MOSFET or a plurality of MOS- FETs connected in series or parallel with each other may be used as the variable resistor. In the case of an N-channel MOSFET, the gate-source voltage increases and the resistance value thereof decreases as the gate voltage rises. In addition, a variable resistor other than a MOSFET may be used.

The resistance value adjusting circuit 120 adjusts the resistance value of the P-channel MOSFET P1 in accordance with the temperature. If the P-channel MOSFET P1 were not provided, since a mutual conductance gm of a MOSFET typically decreases as the temperature rises, the gain of the amplification circuit 100 would decrease as the temperature rises. Accordingly, the resistance value adjusting circuit 120, for example, increases the gate voltage Vg1 as the temperature rises in order to suppress such a decrease in gain. The gate-source voltage decreases as the gate voltage Vg1 rises in the P-channel MOSFET P1. Therefore, the current that flows to the P-channel MOSFET P1 from the power supply voltage Vdd decreases and the loss due to this current decreases, and as a result, the gain of the amplification circuit 100 increases. In addition, the resistance value adjusting circuit 120 decreases the gate voltage Vg1 as the temperature falls. The gate-source voltage increases as the gate voltage Vg1 falls in the P-channel MOSFET P1. Therefore, the current that flows to the P-channel MOSFET P1 from the power supply voltage Vdd increases and the loss due to this current increases, and as a result, the gain of the amplification circuit 100 decreases.

Thus, in the amplification circuit 100, the resistance value adjusting circuit 120 adjusts the resistance value of the P-channel MOSFET P1 by controlling the gate voltage Vg1 in accordance with the temperature, and as a result, the gain of the amplification circuit 100 can be adjusted in accordance with the temperature.

In addition, when the gain of the amplification circuit 100 is reduced by reducing the resistance value of the P-channel MOSFET P1, there is a benefit in terms of distortion characteristics since the amplitude of the voltage of the output terminal of the N-channel MOSFET N2 decreases.

Furthermore, since there is no need to change the input impedance of the input signal Pin and the operation currents of the N-channel MOSFETs N1 and N2 when the gain of the amplification circuit 100 is adjusted by changing the resistance value of the P-channel MOSFET P1, there is little effect on the noise figure. In addition, a large current would have to be supplied to the N-channel MOSFET N1 when the temperature is high in the case where the gain of the amplification circuit 100 is controlled to be constant by changing the bias voltage BIAS1. In contrast, since the gain is adjusted by changing the resistance value of the P-channel MOSFET P1 in the amplification circuit 100, an increase in current in the amplification circuit 100 that occurs when the temperature is high can be suppressed.

Figure 2:
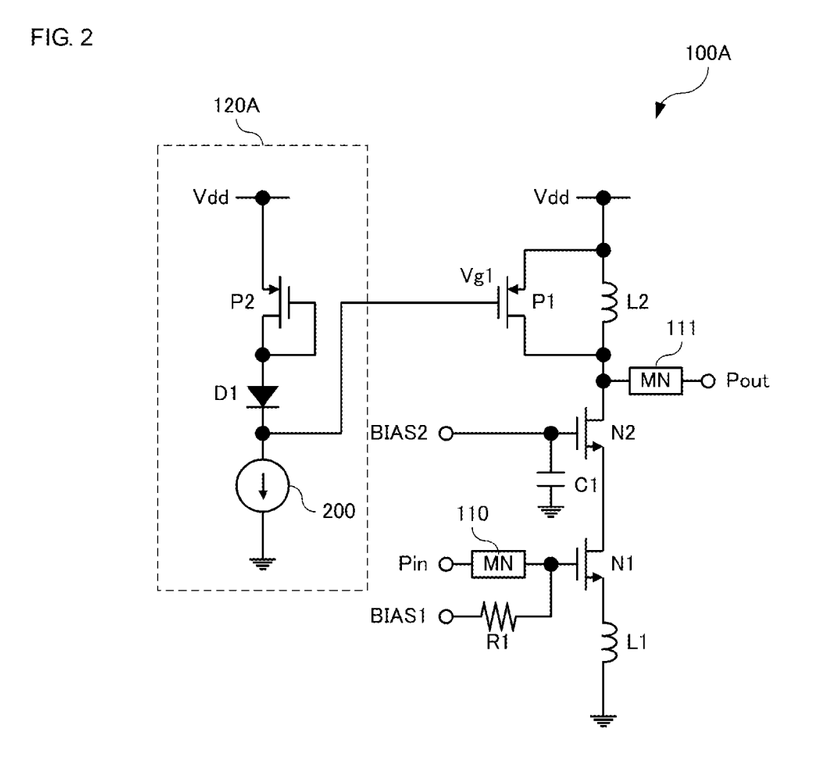
FIG. 2 illustrates the configuration of an amplification circuit, which is an example of the amplification circuit illustrated in FIG. 1.

FIG. 2 illustrates the configuration of an amplification circuit 100A, which is an example of the amplification circuit 100. A resistance value adjusting circuit 120A, which is an example of the resistance value adjusting circuit 120, is illustrated in FIG. 2. The resistance value adjusting circuit 120A includes a P-channel MOSFET P2, a diode D1 and a current source 200.

The power supply voltage Vdd is supplied to the source of the P-channel MOSFET P2 (second FET) and the gate and the drain of the P-channel MOSFET P2 are connected to each other. Thus, the P-channel MOSFET P2 is diode connected. An anode of the diode D1 (first voltage generating circuit) is connected to the drain of the P-channel MOSFET P2 and a cathode of the diode D1 is connected to an input terminal of the current source 200. The current source 200 (first current generating circuit) is a current source that generates a constant current or a variable current (first current).

In the resistance value adjusting circuit 120A, a current generated by the current source 200 flows through the P-channel MOSFET P2. First, considering the configuration while ignoring the diode D1, the P-channel MOSFETs P1 and P2 are current mirror connected with respect to each other. Therefore, the resistance value of the P-channel MOSFET P1 can be adjusted without necessarily being affected by the power supply voltage Vdd or the threshold voltage of the P-channel MOSFET.

In the amplification circuit 100A, the voltage of the cathode of the diode D1 of the resistance value adjusting circuit 120A (first voltage) is the gate voltage Vg1 of the P-channel MOSFET P1. Here, the voltage of the cathode of the diode D1 is a voltage that is lower than the gate voltage of the P-channel MOSFET P2 by an amount equal to the forward voltage of the diode D1. The P-channel MOSFET P2 has a characteristic that the threshold voltage thereof decreases as the temperature rises (for example, −1 mV/° C.). In addition, the diode D1 has a characteristic that the forward voltage thereof decreases as the temperature rises (for example, −2 mV/° C.). Therefore, the resistance value adjusting circuit 120A increases the gate voltage Vg1 of the P-channel MOSFET P1 as the temperature rises (for example, 3 mV/° C.). As a result of the gate voltage Vg1 of the P-channel MOSFET P1 increasing by an amount equal to the change in the forward voltage of the diode D1 with temperature and the change in the threshold voltage of the P-channel MOSFET P1 with temperature, the resistance value of the P-channel MOSFET P1 increases and the gain of the amplification circuit 100A increases. Therefore, a reduction in gain that occurs as the temperature increases can be suppressed in the amplification circuit 100A.

The resistance value adjusting circuit 120A includes one P-channel MOSFET and one diode, but the numbers of these elements are not limited to this. For example, for each of the P-channel MOSFET and the diode, the number of elements connected in series may be appropriately adjusted in accordance with the range over which the gate voltage Vg1 of the P-channel MOSFET P1 is to be adjusted.

In addition, the resistance value adjusting circuit 120A may adjust the resistance value of the P-channel MOSFET P1 by adjusting the current generated by the current source 200 in accordance with the temperature. This is also the case in other embodiments described below.

Figure 3:
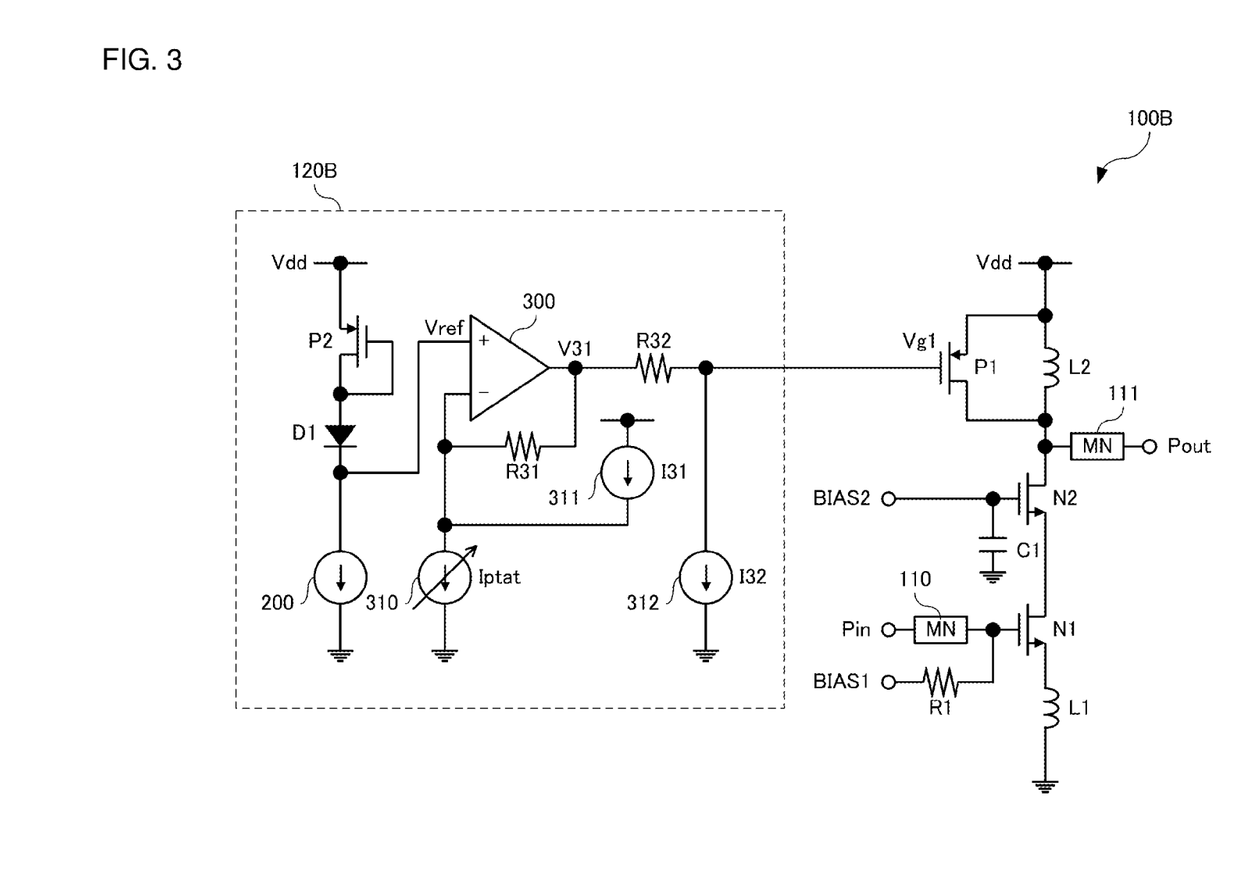
FIG. 3 illustrates the configuration of an amplification circuit, which is an example of the amplification circuit illustrated in FIG. 1.

FIG. 3 illustrates the configuration of an amplification circuit 100B, which is an example of the amplification circuit 100. A resistance value adjusting circuit 120B, which is an example of the resistance value adjusting circuit 120, is illustrated in FIG. 3. Elements of the resistance value adjusting circuit 120B that are the same as those of the resistance value adjusting circuit 120A illustrated in FIG. 2 are denoted by the same symbols and detailed description thereof is omitted. The resistance value adjusting circuit 120B includes the P-channel MOSFET P2, the diode D1, current sources 200 and 310 to 312, an operational amplifier 300, and resistors R31 and R32.

The non-inverting input terminal of the operational amplifier 300 (second voltage generating circuit) is connected to the cathode of the diode D1. The output terminal of the operational amplifier 300 is connected to the inverting input terminal of the operational amplifier 300 via the resistor R31. The output terminal of the operational amplifier 300 is connected to the gate of the P-channel MOSFET P1 via the resistor R32. The inverting input terminal of the operational amplifier 300 is connected to an input terminal of the current source 310.

The current source 310 (second current generating circuit) generates a current Iptat (second current) having a magnitude that changes in accordance with the temperature. The current Iptat can be a current that is directly proportional to the temperature, for example. The current source 310 is not limited to having these temperature characteristics.

The current source 311 generates a current I31 that is a constant current. An output terminal of the current source 311 is connected to the input terminal of the current source 310.

The current source 312 generates a current I32 that is a constant current. An input terminal of the current source 312 is connected between the resistor R32 and the gate of the P-channel MOSFET P1.

Operation of the resistance value adjusting circuit 120B will be described next. Here, Vref represents a voltage that is supplied to the non-inverting input terminal of the operational amplifier 300, V31 represents a voltage of the output terminal of the operational amplifier 300 (second voltage), and R31 and R32 respectively represent the resistance values of the resistors R31 and R32.

The voltage of the inverting input terminal of the operational amplifier 300 is equal to Vref due to imaginary short circuiting of the operational amplifier 300. In addition, the size of the current that flows through the resistor R31 is equal to Iptat−I31. Therefore, V31=Vref+(Iptat−I31)×R31. Vg1=V31−I32×R32=Vref+(Iptat−I31)×R31−I32×R32 due to a voltage drop from the current I32 and the resistor R32.

In the resistance value adjusting circuit 120B, a voltage Vref also changes in accordance with the temperature due to the temperature characteristics of the P-channel MOSFET P2 and the diode D1. In addition, in the resistance value adjusting circuit 120B, the size of the current Iptat changes in accordance with the temperature. Therefore, the resistance value adjusting circuit 120B can adjust the resistance value of the P-channel MOSFET P1 by adjusting the gate voltage Vg1 of the P-channel MOSFET P1 in accordance with the temperature. In the resistance value adjusting circuit 120B, since the change in the gate voltage Vg1 with temperature can be adjusted using the current Iptat, which changes with temperature, and the resistor R31, it is possible to improve the freedom with which the resistance value is adjusted compared with the resistance value adjusting circuit 120A illustrated in FIG. 2.

The P-channel MOSFET P2 and the diode D1 do not necessarily have to be provided in the resistance value adjusting circuit 120B. In addition, in the case where the voltage V31 is equal to the gate voltage Vg1, the resistor R32 and the current source 312 do not have to be provided in the resistance value adjusting circuit 120B.

Figure 4A:
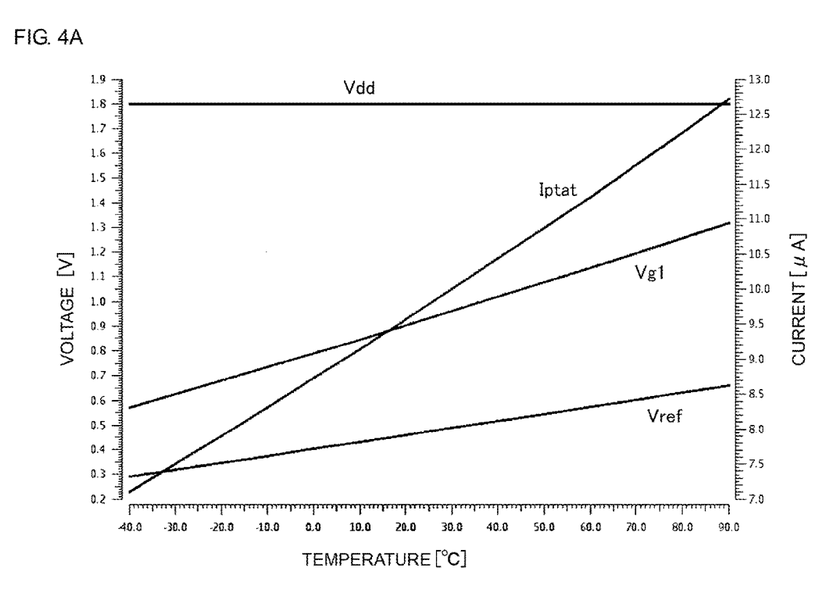
FIG. 4A illustrates simulation results of operation of the amplification circuit of FIG. 3.
Figure 4B:
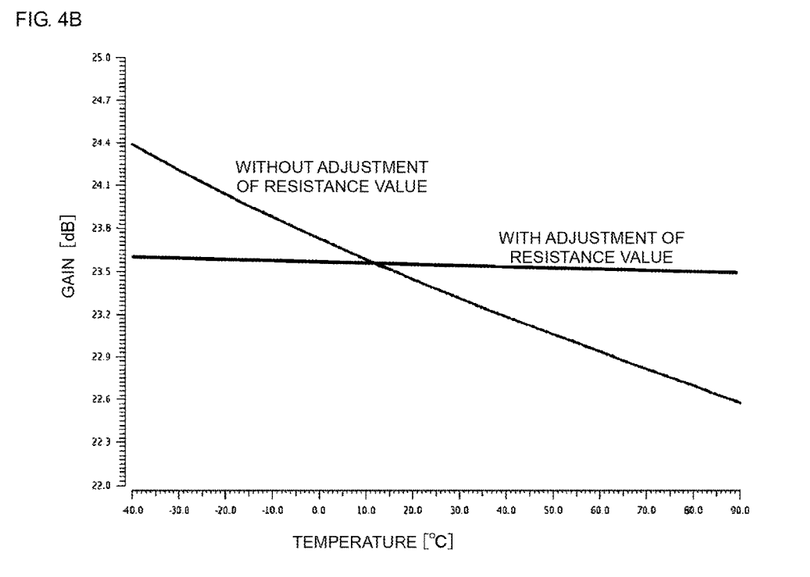
FIG. 4B illustrates simulation results of operation of the amplification circuit of FIG. 3.

FIGS. 4A and 4B illustrates simulation results of operation of the amplification circuit 100B.

In FIG. 4A, the horizontal axis represents temperature (° C.), the vertical axis on the left side represents voltage (V) and the vertical axis on the right side represents current (μA). In FIG. 4A, the power supply voltage Vdd, the voltage Vref applied to the non-inverting input terminal of the operational amplifier 300, the current Iptat having a size that changes in accordance with the temperature, and the gate voltage Vg1 of the P-channel MOSFET P1 are illustrated. As illustrated in FIG. 4A, the power supply voltage Vdd is constant at around 1.8 V. The voltage Vref is generated by adjusting a voltage using a constant gradient resulting from the temperature characteristics of the P-channel MOSFET P2 and the diode D1.

In FIG. 4B, the horizontal axis represents temperature (° C.) and the vertical axis represents the gain (dB) of the amplification circuit 100B. In the amplification circuit 100B, the gain decreases as the temperature rises in the case where there is no P-channel MOSFET P1 (without adjustment of resistance value). In the amplification circuit 100B, as illustrated in FIG. 4A, the gate voltage Vg1 increases as the temperature rises. Thus, as illustrated in FIG. 4B, in the amplification circuit 100B, the decrease in the gain that occurs as the temperature rises can be suppressed and the gain can be kept substantially constant regardless of the temperature.

Figure 5:
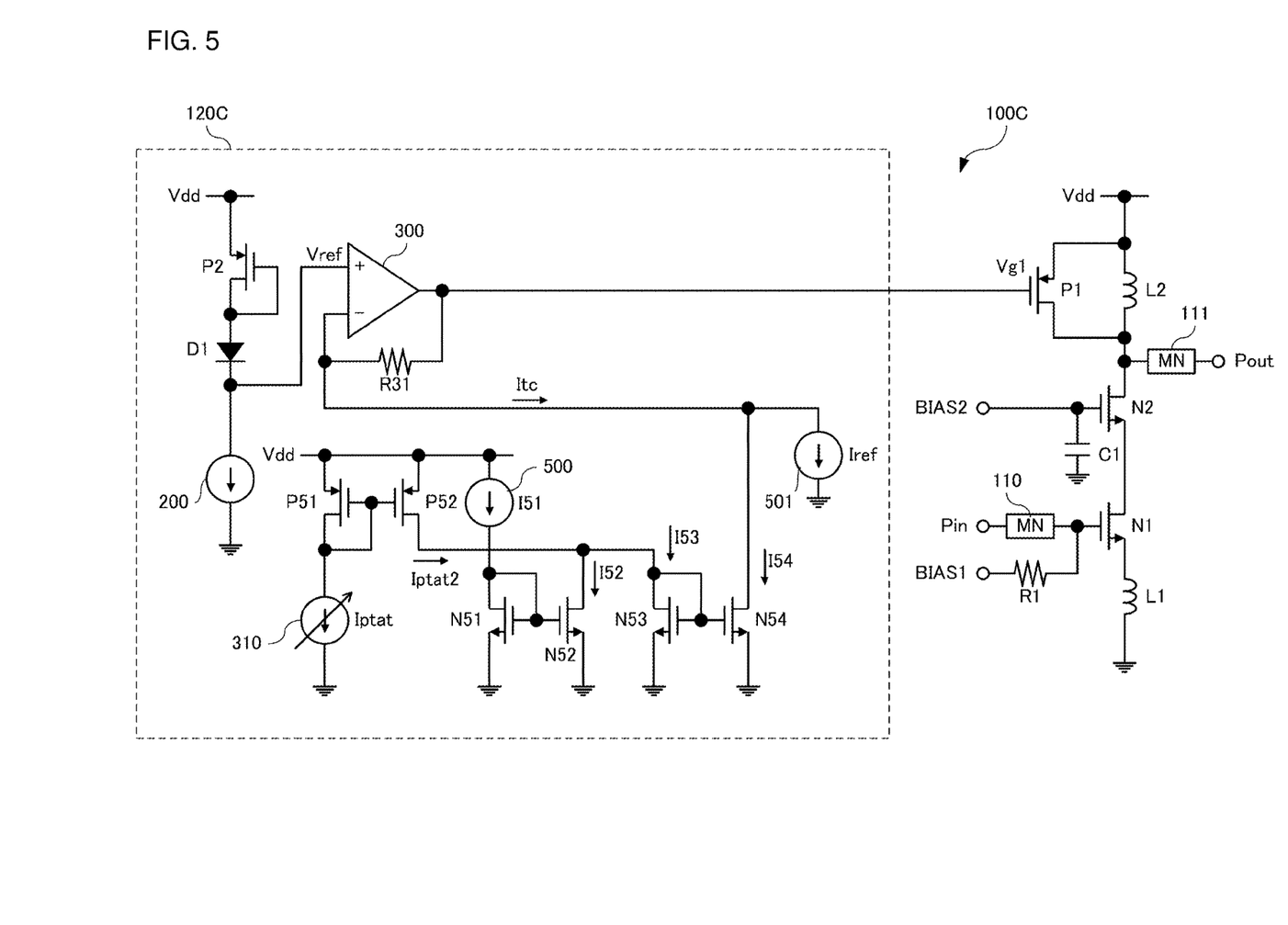
FIG. 5 illustrates the configuration of an amplification circuit, which is an example of the amplification circuit illustrated in FIG. 1.

FIG. 5 illustrates the configuration of an amplification circuit 100C, which is an example of the amplification circuit 100. A resistance value adjusting circuit 120C, which is an example of the resistance value adjusting circuit 120, is illustrated in FIG. 5. Elements of the resistance value adjusting circuit 120C that are the same as those of the resistance value adjusting circuit 120B illustrated in FIG. 3 are denoted by the same symbols and detailed description thereof is omitted. The resistance value adjusting circuit 120C includes P-channel MOSFETs P2, P51 and P52, N-channel MOSFETs N51 to N54, the diode D1, current sources 310, 500 and 501, the operational amplifier 300 and the resistor R31. The P-channel MOSFETs P51 and P52, the N-channel MOSFETs N51 to N54 and the current sources 310, 500 and 501 constitute the second current generating circuit.

The current source 500 generates a current I51, which is a constant current. The current source 501 generates a current Iref that is a constant current.

The P-channel MOSFET P51 is diode connected and the drain thereof is connected to the input terminal of the current source 310. Therefore, the current Iptat flows to the P-channel MOSFET P51.

The P-channel MOSFET P52 is current mirror connected to the P-channel MOSFET P51. Assuming the ratio between the sizes of the P-channel MOSFETs P51 and P52 is 1:M1, a current Iptat2 that flows to the P-channel MOSFET P52 is Iptat2=Iptat1×M1.

The N-channel MOSFET N51 is diode connected and the drain thereof is connected to the output terminal of the current source 500. Therefore, a current I51 flows to the N-channel MOSFET N51.

The N-channel MOSFET N52 is current mirror connected to the N-channel MOSFET N51. In addition, the drain of the N-channel MOSFET N52 is connected to the drain of the P-channel MOSFET P52. Assuming the ratio between the sizes of the N-channel MOSFETs N51 and N52 is 1:M2, a current I52 that flows to the N-channel MOSFET N52 is I52=Iptat2 with an upper limit of I51×M2.

The N-channel MOSFET N53 is diode connected. In addition, the drain of the N-channel MOSFET N53 is connected to the drain of the P-channel MOSFET P52. Therefore, a current I53 that flows through the N-channel MOSFET N53 is I53≈0 A in the case where I51×M2>Iptat× M1. In addition, I53=Iptat2−I52 in the case where I51×M2 Iptat×M1.

The N-channel MOSFET N54 is current mirror connected to the N-channel MOSFET N53. Assuming the ratio between the sizes of the N-channel MOSFETs N53 and N54 is 1:M3, a current I54 that flows to the N-channel MOSFET N54 is I54=I53×M3=(Iptat2−I52)×M3 in the case where I51×M2≤Iptat×M1.

The drain of the N-channel MOSFET N54 and the input terminal of the current source 501 are connected to the inverting input terminal of the operational amplifier 300. Therefore, a current Itc (second current) that flows to the N-channel MOSFET N54 and the current source 501 via the resistor R31 from the output terminal of the operational amplifier 300 is Itc=I54+Iref=(Iptat2−I52)×M3+Iref. The gate voltage Vg1 of the P-channel MOSFET P1 is adjusted to Vref+Itc×R31 by the current Itc.

Figure 6A:
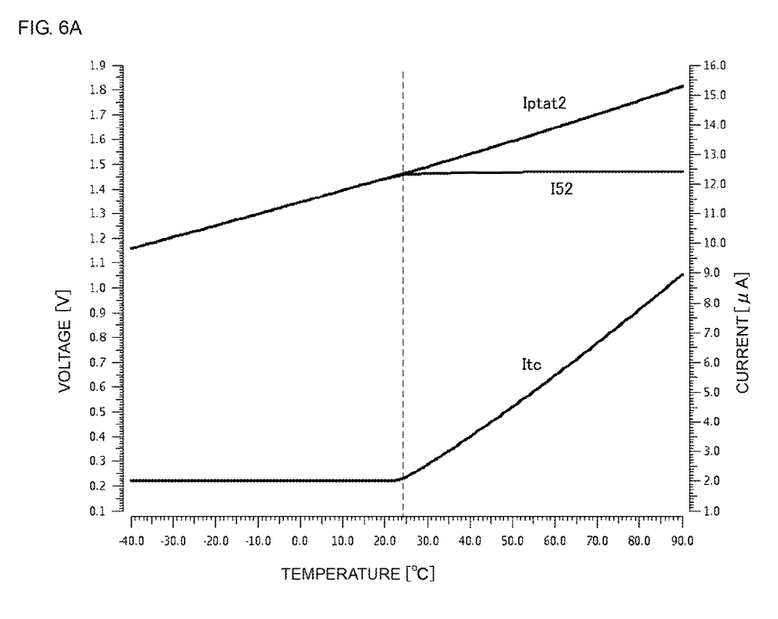
FIG. 6A illustrates simulation results of operation of the amplification circuit of FIG. 5.
Figure 6B:
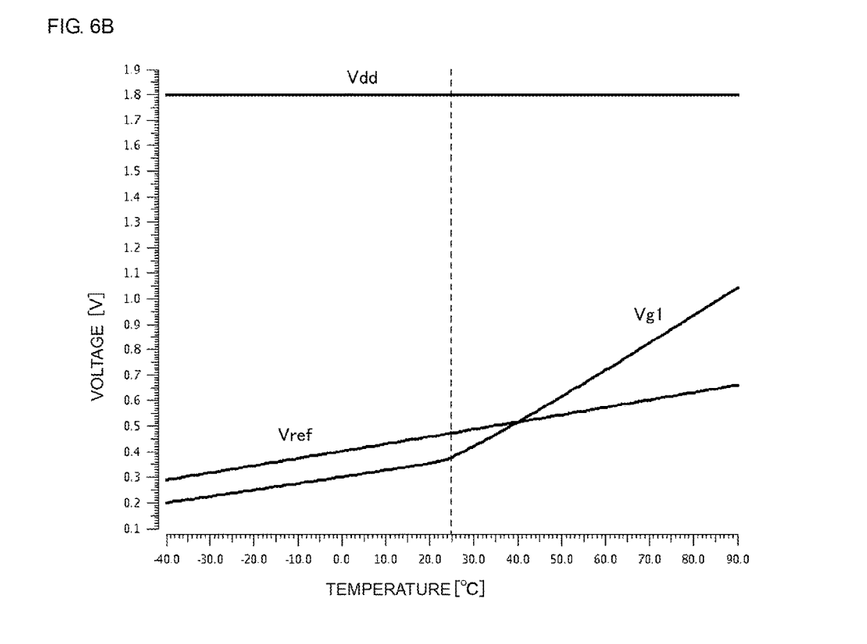
FIG. 6B illustrates simulation results of operation of the amplification circuit of FIG. 5.
Figure 6C:
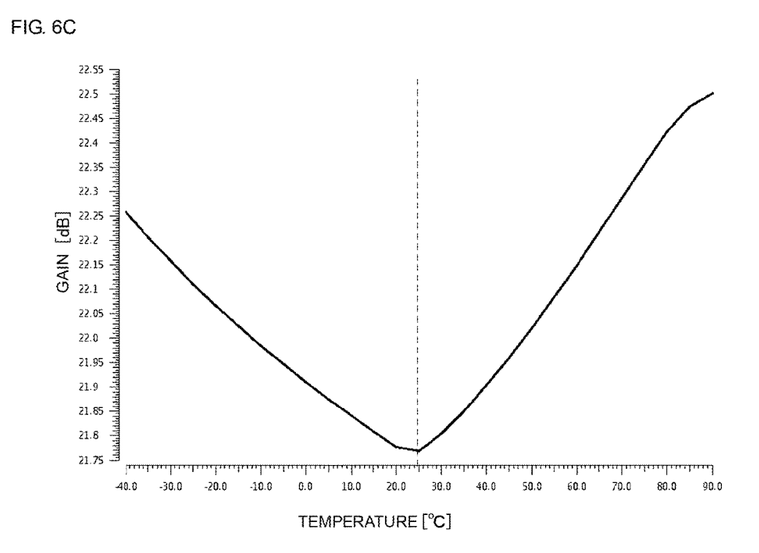
FIG. 6C illustrates simulation results of operation of the amplification circuit of FIG. 5.

FIGS. 6A to 6C illustrates simulation results of operation of the amplification circuit 100C. The operation of adjusting the gain of the amplification circuit 100C will be described while referring to FIGS. 6A to 6C.

In FIG. 6A, the horizontal axis represents temperature (° C.), the vertical axis on the left side represents voltage (V) and the vertical axis on the right side represents current (μA). The current Iptat2 having a size that changes with temperature, the current I52 that flows through the N-channel MOSFET N52 and the current Itc that flows through the resistor R31 are illustrated in FIG. 6A. The current Iptat2 increases as the temperature rises. The current I52 changes in a similar manner to the current Iptat2 as the temperature rises, but is constant after reaching the upper limit (I52×M2). In the simulation illustrated in FIG. 6A, the current I52 becomes constant at around 25° C. Since the current Itc= (Iptat2−I52)×M3+Iref, Itc=Iref (around 2.0 μA) at around 25° C. or lower (first temperature region). At a temperature of around 25° or higher (second temperature region), the current Itc increases as the temperature rises.

In FIG. 6B, the horizontal axis represents temperature (° C.) and the vertical axis represents voltage (V). In FIG. 6B, the power supply voltage Vdd, the voltage Vref that is applied to the non-inverting input terminal of the operational amplifier 300 and the gate voltage Vg1 of the P-channel MOSFET P1 are illustrated. As illustrated in FIG. 6B, the power supply voltage Vdd is constant at around 1.8 V. The voltage Vref can change with the temperature because of the temperature characteristics of the P-channel MOSFET P2 and the diode D1.

In FIG. 6C, the horizontal axis represents temperature (° C.) and the vertical axis represents the gain (dB) of the amplification circuit 100C. As illustrated in FIG. 6B, the gradient of the gate voltage Vg1 changes at around 25° C. Thus, the gain can be changed at around 25° C. in the amplification circuit 100C, as illustrated in FIG. 6C.

The current source 501 is provided in the resistance value adjusting circuit 120C illustrated in FIG. 5 in order to adjust the lowest values of the current Itc (for example, around 2.0 μA), but the current source 501 does not have to be provided.

Figure 7:
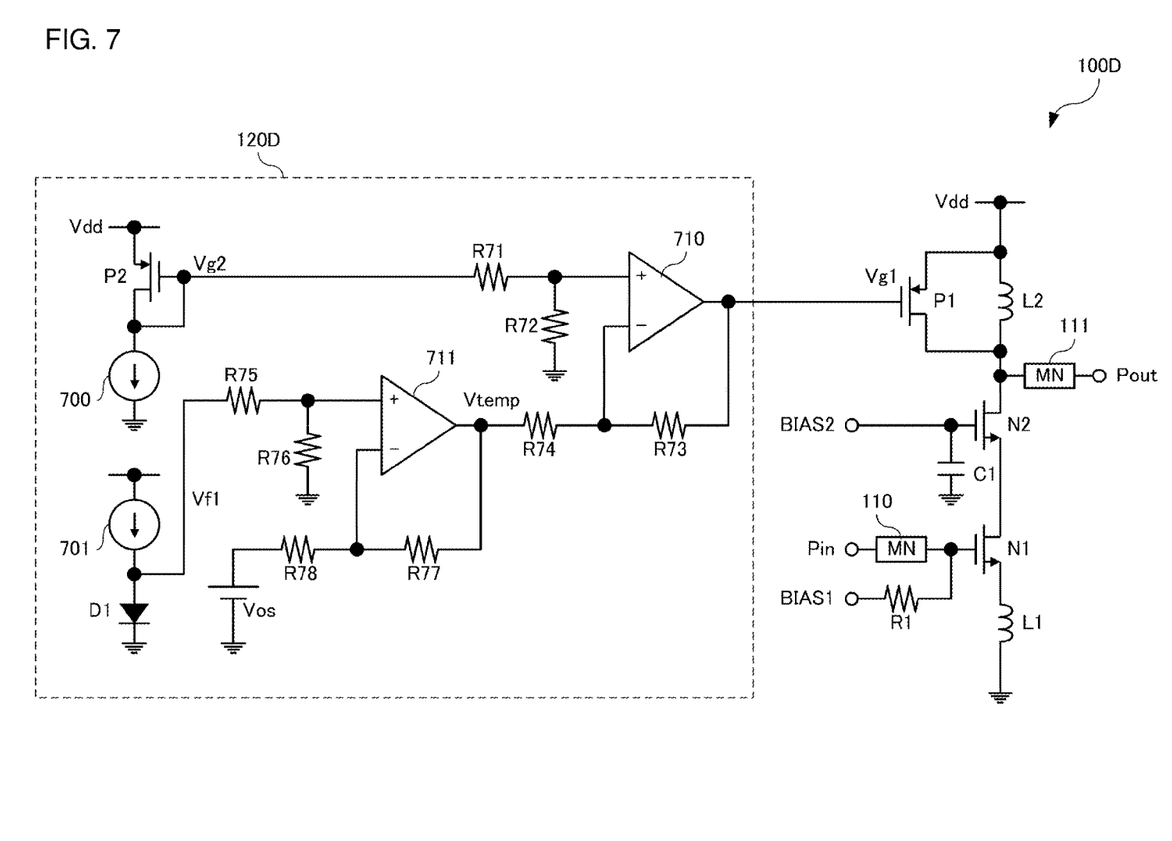
FIG. 7 illustrates the configuration of an amplification circuit, which is an example of the amplification circuit illustrated in FIG. 1.

FIG. 7 illustrates the configuration of an amplification circuit 100D, which is an example of the amplification circuit 100. A resistance value adjusting circuit 120D, which is an example of the resistance value adjusting circuit 120, is illustrated in FIG. 7. Elements of the resistance value adjusting circuit 120D that are the same as those of the resistance value adjusting circuit 120B illustrated in FIG. 3 are denoted by the same symbols and detailed description thereof is omitted. The resistance value adjusting circuit 120D includes the P-channel MOSFET P2, the diode D1, current sources 700 and 701, operational amplifiers 710 and 711 and resistors R71 to R78.

The current source 700 is a current source that generates a constant current or a variable current. The P-channel MOSFET P2, which is diode connected, is connected to an input terminal of the current source 700.

The current source 701 is a current source that generates a constant current or a variable current. An output terminal of the current source 701 is connected to the anode of the diode D1. The cathode of the diode D1 is grounded.

The non-inverting input terminal of the operational amplifier 710 is connected to the gate of the P-channel MOSFET P2 via the resistor R71. One end of the resistor R72 is connected between the non-inverting input terminal of the operational amplifier 710 and the resistor R71, and the other end of the resistor R72 is grounded. The output terminal of the operational amplifier 710 is connected to the inverting input terminal of the operational amplifier 710 via the resistor R73. The output terminal of the operational amplifier 710 is connected to the gate of the P-channel MOSFET P1. The inverting input terminal of the operational amplifier 710 is connected to the operational amplifier 711 via the resistor R74. A gate voltage Vg2 of the P-channel MOSFET P2 changes in accordance with variations in the power supply voltage Vdd or the threshold voltage of the P-channel MOSFET. The gate voltage Vg1 of the P-channel MOSFET P1 changes so as to cancel out the effects of variations in the power supply voltage Vdd or the threshold voltage of the P-channel MOSFET that occur with changes in the gate voltage Vg2.

The non-inverting input terminal of the operational amplifier 711 is connected to the anode of the diode D1 via the resistor R75. One end of the resistor R76 is connected between the non-inverting input terminal of the operational amplifier 711 and the resistor R75, and the other end of the resistor R76 is grounded. The output terminal of the operational amplifier 711 is connected to the inverting input terminal of the operational amplifier 711 via the resistor R77. An offset voltage Vos is supplied to one end of the resistor R78 and the other end of the resistor R78 is connected to the inverting input terminal of the operational amplifier 711. A voltage Vf1 of the anode of the diode D1 changes in accordance with the temperature characteristics of the diode D1. Therefore, a voltage Vtemp output from the operational amplifier 711 also changes in accordance with the temperature. The changes that occur in the voltage Vtemp with temperature correspond to changes that occur in the gain of the operational amplifier 711 with temperature.

With this configuration, similarly to as in the amplification circuit 100B, the effect of variations in the power supply voltage Vdd or the threshold voltage of the P-channel MOSFET is suppressed in the amplification circuit 100D, and the gain of the amplification circuit 100D can be adjusted in accordance with the temperature.

Exemplary embodiments of the present disclosure have been described above. According to an embodiment, the resistance value adjusting circuit 120 adjusts the resistance value of a variable resistor in accordance with the temperature, and as a result, the gain of the amplification circuit 100 can be adjusted in accordance with the temperature. For example, as illustrated in FIG. 4B, the gain of the amplification circuit 100 can be made substantially constant regardless of the temperature.

In addition, according to an embodiment, a variable resistor can be realized using a MOSFET.

In addition, according to an embodiment, a voltage (for example, Vref illustrated in FIG. 3) that changes in accordance with the gate voltage of the P-channel MOSFET P2 can be generated and the gate voltage Vg1 of the P-channel MOSFET P1 can be adjusted on the basis of this voltage. Thus, the resistance value of the P-channel MOSFET P1 can be adjusted without necessarily being affected by variations in the power supply voltage Vdd or a P-channel MOSFET threshold voltage.

In addition, according to an embodiment, a voltage (for example, Vref illustrated in FIG. 3) that changes in accordance with the gate voltage of the P-channel MOSFET P2 can be realized using a diode.

In addition, according to an embodiment, the gate voltage Vg1 of the P-channel MOSFET P1 can be adjusted on the basis of a current that changes in accordance with the temperature (for example, Iptat illustrated in FIG. 3). Thus, for example, compared with the case where the gate voltage Vg1 is adjusted using just the diode D1, it is possible to make the degree of freedom when adjusting the gate voltage of the P-channel MOSFET P1 comparatively high.

Furthermore, according to an embodiment, as illustrated in FIG. 6A, for example, the current Itc, which has a different rate of change depending on the temperature, can be generated and the gate voltage of the P-channel MOSFET P1 can be adjusted on the basis of the current Itc. Thus, for example, as illustrated in FIG. 6C, the gain of the amplification circuit can be changed depending on the temperature.

The purpose of the embodiments described above is to enable easy understanding of the present invention and the embodiments are not to be interpreted as limiting the present invention. The present invention can be changed or improved without departing from the gist of the invention and equivalents to the present invention are also included in the present invention. In other words, appropriate design changes made to the embodiments by one skilled in the art are included in the scope of the present invention so long as the changes have the characteristics of the present invention. For example, the elements included in the embodiment and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present invention so long as the combined elements have the characteristics of the present invention.

While embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An amplification circuit that amplifies an input signal and outputs an amplified signal, the amplification circuit comprising:
    an amplification element that outputs the amplified signal from an output terminal;
    an inductor having one end to which a power supply voltage is supplied and another end that is connected to the output terminal of the amplification element;
    a variable resistance element that is connected in parallel with the inductor; and
    a resistance value adjusting circuit that is configured to adjust a resistance value of the variable resistance element in accordance with a temperature of the amplification circuit.

2. The amplification circuit according to claim 1,
wherein the variable resistance element comprises a first field-effect transistor (FET), and
the resistance value adjusting circuit is configured to adjust a gate voltage of the first FET in accordance with the temperature.

3. The amplification circuit according to claim 2,
wherein the resistance value adjusting circuit comprises:
    a first current generating circuit configured to generate a first current,
    a second FET that is diode connected and through which the first current flows, and
    a first voltage generating circuit configured to generate a first voltage that changes in accordance with a gate voltage of the second FET, and
wherein the resistance value adjusting circuit is configured to adjust the gate voltage of the first FET based on the first voltage.

4. The amplification circuit according to claim 3,
wherein the first voltage generating circuit comprises a diode that is connected to the second FET.

5. The amplification circuit according to claim 3,
wherein the resistance value adjusting circuit further comprises:
    a second current generating circuit configured to generate a second current that changes in accordance with the temperature, and
    a second voltage generating circuit configured to generate a second voltage that changes in accordance with the second current, and
wherein the resistance value adjusting circuit is configured to adjust the gate voltage of the first FET based on the second voltage.

6. The amplification circuit according to claim 5,
wherein a rate of change of the second current with respect to temperature in a first temperature region is different from and a rate of change of the second current with respect to temperature in a second temperature region.

7. The amplification circuit according to claim 6,
wherein the second temperature region is greater than the first temperature region,
wherein the second current is constant in the first temperature region, and
wherein the second current increases as temperature increases in the second temperature region.

8. The amplification circuit according to claim 4,
wherein the resistance value adjusting circuit further comprises:
    a second current generating circuit configured to generate a second current that changes in accordance with the temperature, and
    a second voltage generating circuit configured to generate a second voltage that changes in accordance with the second current, and
wherein the resistance value adjusting circuit is configured to adjust the gate voltage of the first FET on the basis of the second voltage.

9. The amplification circuit according to claim 8,
wherein a rate of change of the second current when the temperature is in a first temperature region, and a rate of change of the second current when the temperature is in a second temperature region, are different from each other.

10. The amplification circuit according to claim 9,
wherein the second temperature region is greater than the first temperature region,
wherein the second current is constant in the first temperature region, and
wherein the second current increases as temperature increases in the second temperature region.

* * * * *

UNITED STATES PATENT AND TRADEMARK OFFICE
CERTIFICATE OF CORRECTION

PATENT NO. : 9,948,255 B2
APPLICATION NO. : 15/639397
DATED : April 17, 2018
INVENTOR(S) : Makoto Tabei et al.

It is certified that error appears in the above-identified patent and that said Letters Patent is hereby corrected as shown below:

In the Specification

Column 6, Line 60, "$I51 \times M2$" should be -- $I51 \times M2 \leq$ --.

Signed and Sealed this
Twenty-sixth Day of June, 2018

Andrei Iancu
*Director of the United States Patent and Trademark Office*